(12) United States Patent
Nagai et al.

(10) Patent No.: US 7,049,169 B2
(45) Date of Patent: May 23, 2006

(54) METHOD OF FABRICATING A SEMICONDUCTOR DEVICE

(75) Inventors: Kouichi Nagai, Kawasaki (JP); Hideyuki Kanemitsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/351,355

(22) Filed: Jan. 27, 2003

(65) Prior Publication Data

US 2004/0048412 A1    Mar. 11, 2004

(30) Foreign Application Priority Data

Aug. 22, 2002    (JP)    ............................. 2002-242074

(51) Int. Cl.
*H01L 51/40*    (2006.01)
(52) U.S. Cl. ........................................................ 438/99
(58) Field of Classification Search .................. 438/99
See application file for complete search history.

(56) References Cited

U.S. PATENT DOCUMENTS

| 4,352,724 | A  | * | 10/1982 | Sugishima et al. .... | 204/192.37 |
| 6,284,427 | B1 | * | 9/2001  | Okazaki et al. ......... | 430/270.1 |
| 6,376,152 | B1 | * | 4/2002  | Kawabe et al. ......... | 430/270.1 |
| 6,692,884 | B1 | * | 2/2004  | Fujimori et al. ........ | 430/170 |
| 2004/0259029 | A1 | * | 12/2004 | Nagahara et al. ....... | 430/270.1 |

FOREIGN PATENT DOCUMENTS

| EP | 0838727 A1 | * | 10/1997 |
| JP | 2001-100400 | * | 4/2001 |
| WO | WO99/15935 |   | 4/1999 |

OTHER PUBLICATIONS

Stanley Wolf Silicon Processing for the VSLI Era vol. 1 Lattice Press 1986 p. 518.*

* cited by examiner

*Primary Examiner*—David S. Blum
(74) *Attorney, Agent, or Firm*—Westerman, Hattori Daniels & Adrian, LLP

(57) ABSTRACT

According to the present invention, by applying a basic surface-processing agent to a film underlying a resist, the excessive photoacid present at the interface between the resist and the front-end film is neutralized and the pattern shape can be controlled. The present invention provides a method of manufacturing a semiconductor device including the steps of, forming an insulating film on a surface, applying a surface processing agent containing of at least a solvent and a basic component on the insulating film, applying a resist on the insulating film thus applied with the surface processing agent, patterning the resist by lithography, and transferring a resist pattern to the insulating film by a dry etching process.

18 Claims, 11 Drawing Sheets

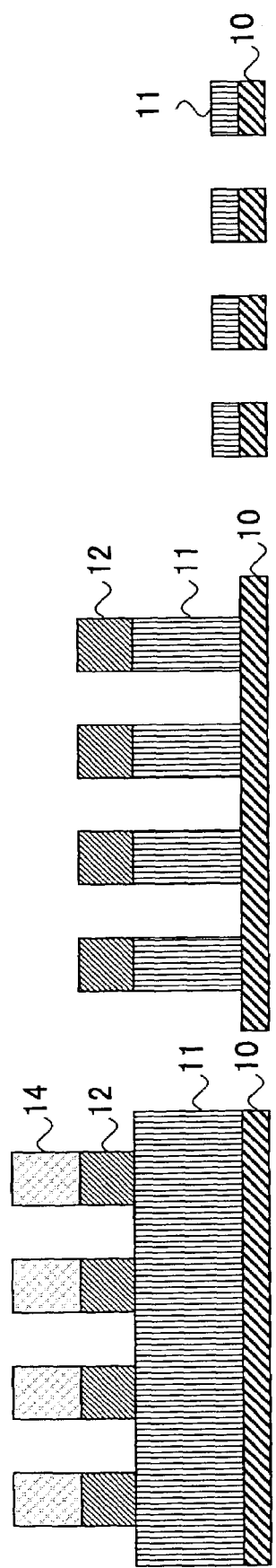

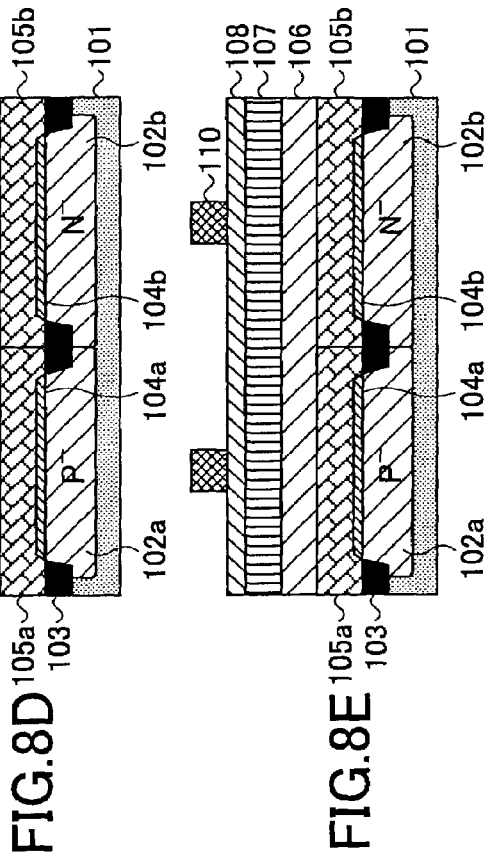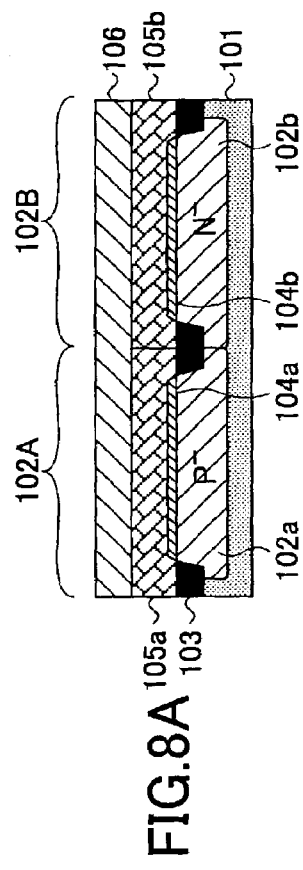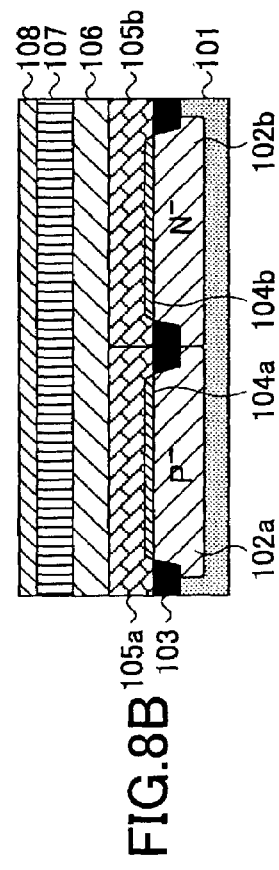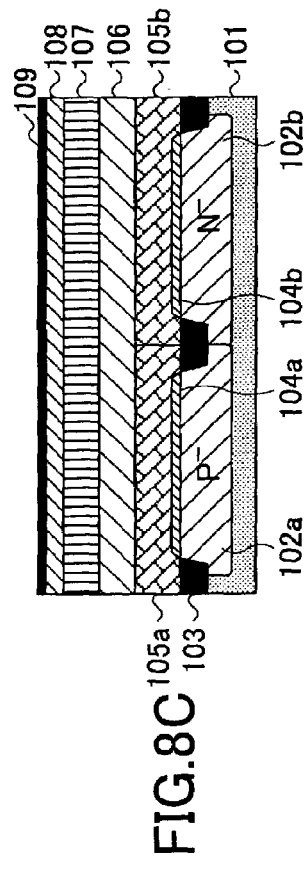

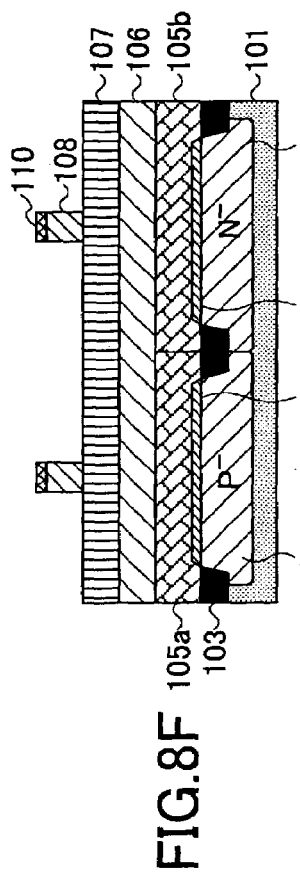
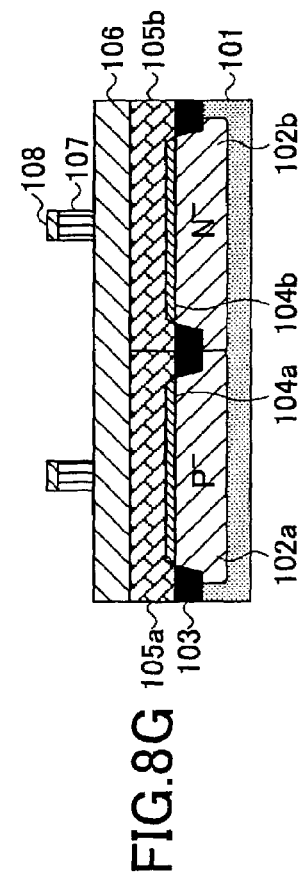
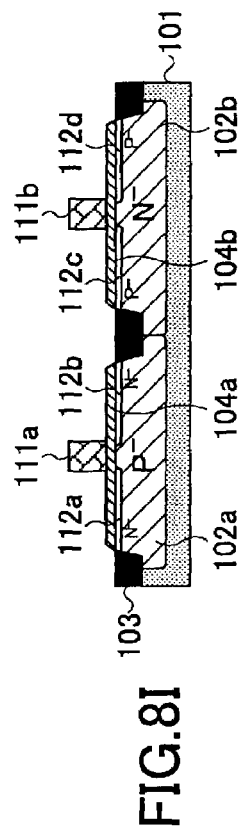
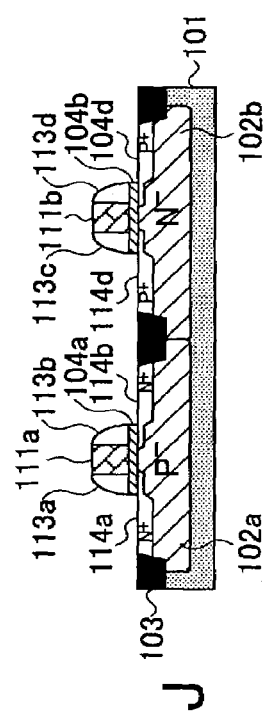
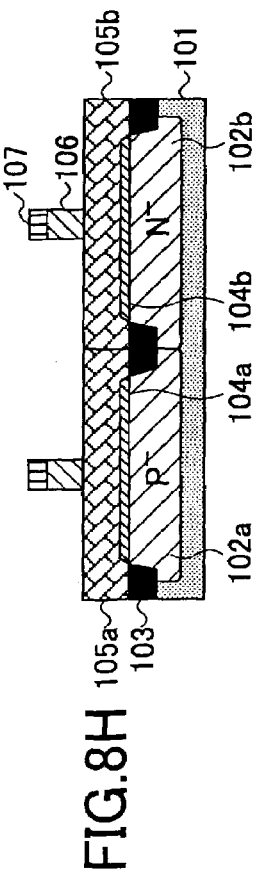

METHOD OF FABRICATING A SEMICONDUCTOR DEVICE

CROSS-REFERENCE TO RELATED APPLICATIONS

This patent application is based on Japanese priority Patent Application No. 2002-242074 filed on Aug. 22, 2002, the entire contents of which are hereby incorporated by reference.

BACKGROUND OF THE INVENTION

1. Field of the Invention

The present invention generally relates to semiconductor devices, and in particular, to a method of forming a pattern using a chemical amplification resist.

2. Description of the Related Art

With miniaturization of semiconductor devices, the exposing wavelength used in the lithography process has become very small in recent advanced semiconductor fabrication processes. Particularly, the use of deep ultra-violet (DUV) radiation source such as KrF or ArF excimer lasers is spreading rapidly.

When such DUV is used as the exposing radiation, the resist is more easily influenced by the multiple-interference effect caused by optical reflection at the substrate surface as compared to the case of using conventional i-line radiation. Therefore, in many cases, an anti-reflection coating commonly referred to as BARC (Bottom Anti-Reflection Coating) is provided under the resist so as to reduce the influence of the reflection and multiple-interference on the resist.

Furthermore, in many cases of high-resolution exposure that uses DUV, an optical system having a large numerical aperture is used for enhancing the resolution. When an optical system of large numerical aperture is used, on the other hand, it becomes difficult to secure sufficient focal depth at the time of the exposure as is well known in the art, while this makes it necessary to use a resist of reduced thickness.

In order to solve the problem of etching resistance of the resist, which is caused at the time of using such a thin resist, it is practiced to provide a film having a composition different from the relevant resist under the resist, and etching is performed while using such a film as the mask.

Thus, the use of multi-layered resist is now becoming an established effective exposure process in the art of high-resolution photolithography that uses DUV.

Moreover, it is now common to use a chemical amplification resist in the art of high-resolution photolithography for achieving the high resolution and high photosensitivity for the resist. A chemical amplification resist is a resist containing a photoacid generator and the photoacid generator releases a photoacid upon exposure. In the chemical amplification resist, the release of photoacid is accelerated by the catalytic action of the photoacid, and the resist is changed rapidly to have an alkali-soluble molecular structure after the exposure. This type of resist is called positive-type Further, there is also a chemical amplification resist of negative type.

In the case of using such a chemical amplification resist, it should be noted that the size and resolution of the resist patterns may change depending on the degree of diffusion of the photoacid. For example, the exposed patterns may be influenced by the existence of acid or base at the interface between the resist and the underlying film.

In the case when a BARC is formed under the resist as mentioned above, for example, there may be a case in which the resist pattern shows a defective shape called skirting in which the resist remains at the bottom part of the pattern from which the resist should be removed. This phenomenon occurs when the photoacid released by the photoacid generator of the resist is deactivated by a component contained in the BARC.

Hereinafter, the process using the multi-layered resist will be considered for the case of a three-layer process. It should be noted that the three-layer process is a method in which an insulating film such as an SOG film is formed under the resist and a polymer film such as a novolac resin film and the like is formed further under the SOG film. In the three-layer process, the desired patterning is achieved in a layer located underneath the polymer film.

Thus, a pattern formation is conducted at first by etching the SOG film while using the chemical amplification resist pattern formed thereon as a mask, and the polymer film is then etched while using the patterned SOG film as the mask. Further, the pattern thus formed in the polymer film is transferred to the layer underneath the polymer film by a dry etching process or the like. This layer may be an insulating film such as a silicon oxide film.

In this three-layer process, the polymer film functions as the BARC or anti-reflection as noted before. This three-layer process has an advantageous feature of enabling the use of thin resist at the top and is used extensively these days.

In the above-noted three-layer process, on the other hand, there can be a case in which the photoacid released from the chemical amplification resist at the top of the three-layer structure is deactivated by the components in the SOG film provided right underneath the resist, similarly to the case in which the BARC is used underneath the chemical amplification resist. Thereby a similar problem of skirting may occur.

In order to deal with this problem, it is practiced currently to add a photoacid generator to the BARC film or to the SOG film so as to compensate for the deactivated acid.

When a photoacid generator is added to the film right underneath the resist, the acid concentration at the interface between the BARC and the resist, or at the interface between the SOG and the resist, increases, wherein the excessive acid thus introduced removes the protective group of the resist and makes the resist alkali-soluble. Thus, such an approach gives rise to another problem of formation of cut-in at the resist interface. In the case of a negative resist, such an approach causes the problem of skirting or scum residue formation at the bottom part of the resist.

In the case of using an SOG film, in particular, there arises a further problem in that the adhesion to the resist may be deteriorated as a result of addition of such extraneous photoacid generator. Further, because of difficulty in distributing the photoacid generator uniformly on the above SOG film, there arises the problem in that the patterns may vary depending on the location of the wafer surface. Furthermore, the efficiency of the photoacid formation changes depending on the exposure dose, which in turn is changed depending on the covering ratio of the reticle used for the exposure. Thus it is very difficult to control the amount of the photoacid generator appropriately. Further, there has been a problem in that it takes time, in the event the resist is changed, of adding and adjusting the photoacid generator to the SOG film.

FIG. 1A and FIG. 1B show an example of inappropriate or uncontrolled pattern formation obtained for the case of using the conventional three-layered resist process mentioned above.

Referring to FIGS. 1A and 1B, the patterns A and B are separated from the substrate to be processed and it can be seen that the pattern A is toppled and lying on the substrate. It is believed that this phenomenon is caused because of the existence of excessive acid at the interface between the resist and the underlying film.

SUMMARY OF THE INVENTION

Accordingly, it is a general object of the present invention to provide a novel and useful method of fabricating a semiconductor device that overcomes the above problems.

Another and more specific object of the present invention is to control the pattern shape in a photolithographic process that uses a chemical amplification resist by neutralizing the excessive photoacid at the interface between the chemical amplification resist and the underlying film by applying a basic surface processing agent on the foregoing underlying film.

According to one aspect of the present invention, there is provided a method of fabricating a semiconductor device comprising the steps of: forming an insulating film on a surface to be processed; applying a surface-processing agent including at least a solvent and a basic component to the insulating film; applying a resist on the insulating film thus applied with the surface-processing agent; patterning the resist with lithography; and transferring the pattern of the resist to the insulating film by dry etching.

According to the present invention, problem of defect formation such as toppling of resist pattern or separation of the resist pattern from the underlying layer, which tends to occur when the chemical amplification resist is applied to the insulating film, is effectively prevented by applying the surface-processing agent to the insulating film underlying the chemical amplification resist, and proper resist patterning is guaranteed. The toppling of the resist pattern or separation of the resist pattern from the underlying layer is caused by the existence of excessive photoacid from the photoacid generator, which in turn has been added to the insulating film or to the resist. The excessive photoacid thus existing at the interface between the insulating film and the resist triggers excessive reaction in the resist. In the present invention, the basic surface-processing agent is provided to the insulating film, and the excessive acid mentioned above is neutralized. Thereby, the adversary influences of the excessive photoacid on the resist patterning is suppressed effectively, and proper resist patterning is guaranteed.

BRIEF DESCRIPTION OF THE DRAWINGS

FIGS. 2A–2I are diagrams showing a method of fabricating a semiconductor device according to an embodiment of the present invention;

FIGS. 8A–8J are diagrams showing a method of fabricating a semiconductor according to an embodiment of the present invention.

DESCRIPTION OF THE PREFERRED EMBODIMENTS

The embodiments of the present invention will be explained hereinafter with reference to the drawings.

First Embodiment

The fabricating process of a semiconductor device according to a first embodiment of the present invention will be explained hereinafter with reference to FIG. 2A through FIG. 2I.

Figure 1B:
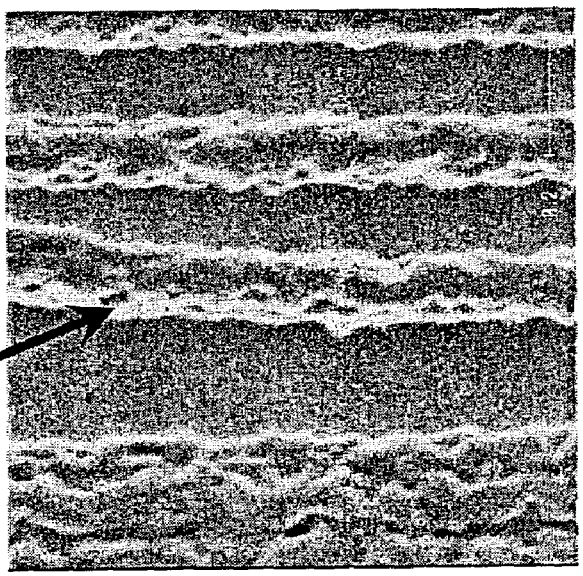
FIGS. 1A and 1B are diagrams showing examples of defective resist patterning caused in a conventional resist patterning process.
Figure 1A:
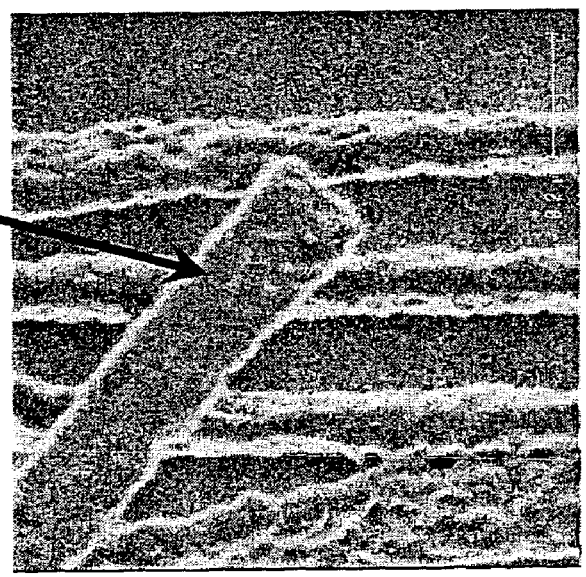
Figure 2A:
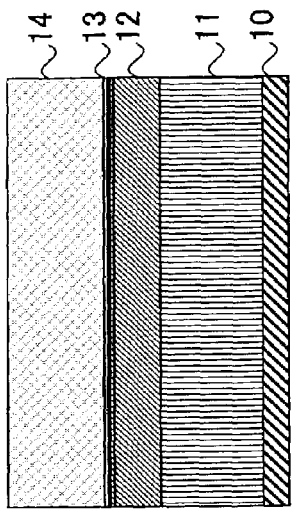

Referring to FIG. 2A, a silicon oxide film 10 is formed on a semiconductor substrate (not shown in the figure) in which semiconductor active elements are formed, and a novolac resin film 11 is applied on the silicon oxide film 10 by a spin-on process as a polymer film. The novolac resin film 11 thus formed is cured subsequently. Further, an SOG film 12 is applied on the novolac film 11 as an inorganic film, wherein the SOG film 12 thus formed is subsequently subjected to a heat treatment process. The SOG film 12 thus formed is added with a photoacid generator. Thus, in the structure of FIG. 2A, the novolac resin film 11 is formed on the silicon oxide 10, and the SOG film 12 is formed further on the novolac resin film 11.

Figure 2B:
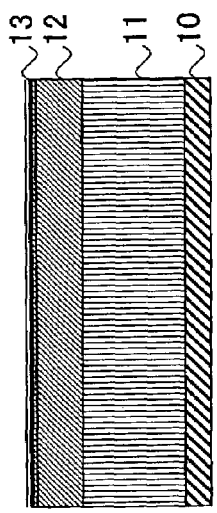

Next, in the step of FIG. 2B, a surface-processing agent 13 is applied to the SOG film 12, wherein the substrate is then subjected to a spin-on process such that the surface-processing agent spread evenly over the surface of the SOG film 12. As will be explained later in detail, this surface-processing agent 13 contains a basic substance dissolved in a solvent.

Conventionally, it should be noted that a solvent such as a thinner has been applied in this stage of processing. In the present invention, on the other hand, the surface-processing agent 13 is applied in place of a thinner. Thus, it should be noted that there occurs no increase in the number of fabrication steps even when the process of the present invention is employed. Further, by applying a resist right after this step in the state the surface-processing agent 13 is still not dry, the effect of enhanced resist applicability or so-called resist saving effect can be obtained, similarly to the case of using a thinner in the conventional process.

Figure 2C:
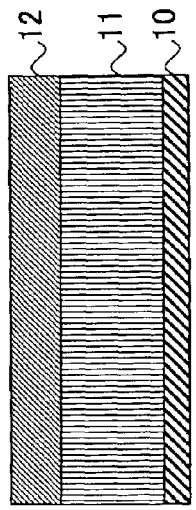

Next, in the step of FIG. 2C, an ArF resist 14 is applied to the structure of FIG. 2B. This resist 14 is a chemical amplification resist and contains a photoacid generator in the form of a photosensitive emulsion, as mentioned above.

Figure 2D:
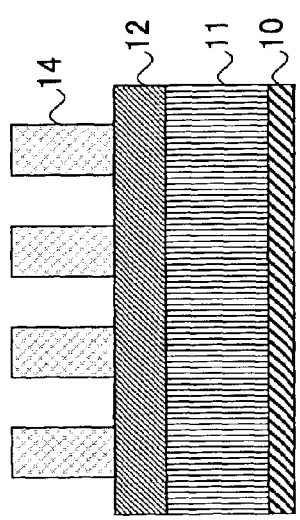

In the step of FIG. 2D, exposure is conducted on the ArF resist 14 while using an ArF excimer laser not illustrated. As mentioned before, the ArF resist 14 and the photoacid generator in the SOG film 12 are photosensitized and a photoacid is released.

Figure 2E:
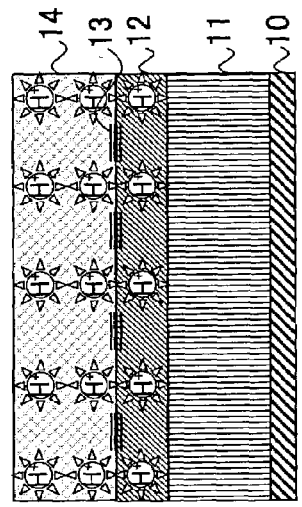

Next, in the step of FIG. 2E, a heating step called PEB (Post Exposure Baking) is conducted on the structure of FIG. 2D, and the photoacid formed by exposure step of FIG. 2D are diffused.

In the conventional process, the photoacid thus released from the photoacid generator in the SOG film causes precipitation at the interface between the SOG film 12 and the resist 14 after the diffusion process through the SOG film 12. This has been the cause of defect formation in the resist pattern such as the toppling of the pattern during the development step of the resist 14 conducted after the exposure step.

In the present invention, on the other hand, because of the fact that the surface-processing agent 13 is applied to the surface of the SOG film 12, the excessive photoacid formed in the SOG film 12 is neutralized and a defect-free pattern formation is guaranteed.

Figure 2F:
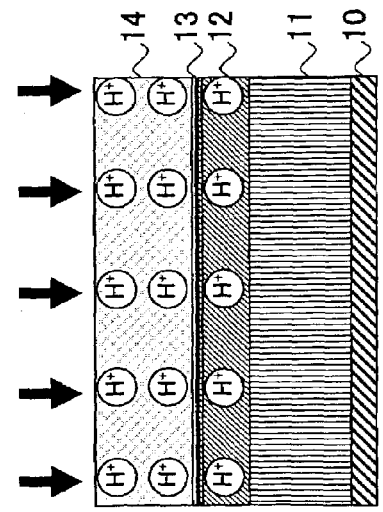

Next, in the step of FIG. 2F, a developing process is conducted on the structure of FIG. 2E and a defect-free resist pattern 14A is obtained from the chemical amplification resist layer 14, without producing defects such as toppled patterns, separated patterns or non-reacted residual patterns caused as a result of deactivation of the photoacid.

Next, in the step of FIG. 2G, a pattern formation is conducted on the SOG film 12 thus processed in the step of FIG. 2E by applying a dry etching process, which may be the one that uses $CHF_3$ and $O_2$ as an etching gas, while using the resist pattern 14 obtained in the step of FIG. 2F as a mask. As a result, an SOG pattern 12A is obtained in conformity with the resist pattern 14A.

Next, in the step of FIG. 2H, the novolac resin 11 underneath the SOG film 12 is patterned by a dry etching process that uses $H_2$ and $O_2$ as the etching gas, while using the SOG pattern 12A formed in the step of FIG. 2G as a mask. As a result, a novolac pattern 11A is formed from the novolac film 11 in conformity with the SOG pattern 12A. In the step of FIG. 2H, it is noted that the resist pattern 14A remaining on the SOG pattern 12A is removed at the time of the dry etching process of the novolac film 11.

Subsequently, in the step of FIG. 2I, patterning is performed on the silicon oxide film 10 provided underneath the novolac resin 11 by conducting a dry etching process that uses $CF_4$ as an etching gas, while using the novolac pattern 11A formed in the step of FIG. 2H as a mask. In the step of FIG. 2H, the SOG pattern 12A remaining on the novolac pattern 11A is removed by conducting an ashing process. Thereby, the desired patterning of the silicon oxide film 10 is completed and a silicon oxide pattern 10A is obtained in conformity with the novolac pattern 11A and hence in conformity with the resist pattern 14A.

In this way, by applying the surface-processing agent 13 of the present invention on the SOG film 12, formation of defective patterns caused by the excessive photoacid at the interface between the chemical amplification resist 14 and the underlying SOG film 12 is successfully suppressed, and defect-free patterning becomes possible.

Furthermore, contrary to the conventional case in which the composition of the SOG film had to be adapted to the composition of the resist film 14 each time the composition of the resist film 14 is changed, the change of the resist film 14 is easily attended to in the case of the present invention by merely modifying the binder of the surface-processing agent with regard to the basic component contained therein. Further, the present invention can easily attend to the change the of reticle coverage ratio also by merely adjusting the basic component similarly to the case noted above. Further, the basic component is easily dispersed uniformly over the entire wafer surface, and the problem of in-plane variation of patterning is also eliminated.

Hereinafter, description will be made on the basic surface-processing agent of the present invention.

The basic surface-processing agent of the present invention contains a basic component in a solvent and achieves the desired optimization of resist pattern shape by adjusting the composition thereof within a range of 90 to 99.99% for the solvent and 0.01 to 10% for the basic component.

In a preferred embodiment, a mixed solution of PGMEA (propylene glycol monomethyl ether acetate)/PGME (propylene glycol monomethyl ether) is used for the solvent. Further, a basic component having the structure of

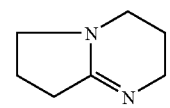

is used in the present invention. Other basic components such as organic amine, and ammonia salt can also be used.

Second Embodiment

Next, improvement achieved by the present invention with regard to the resist pattern toppling will be explained with reference to FIG. 3 to FIG. 5 as a second embodiment of the present invention.

Figure 3:
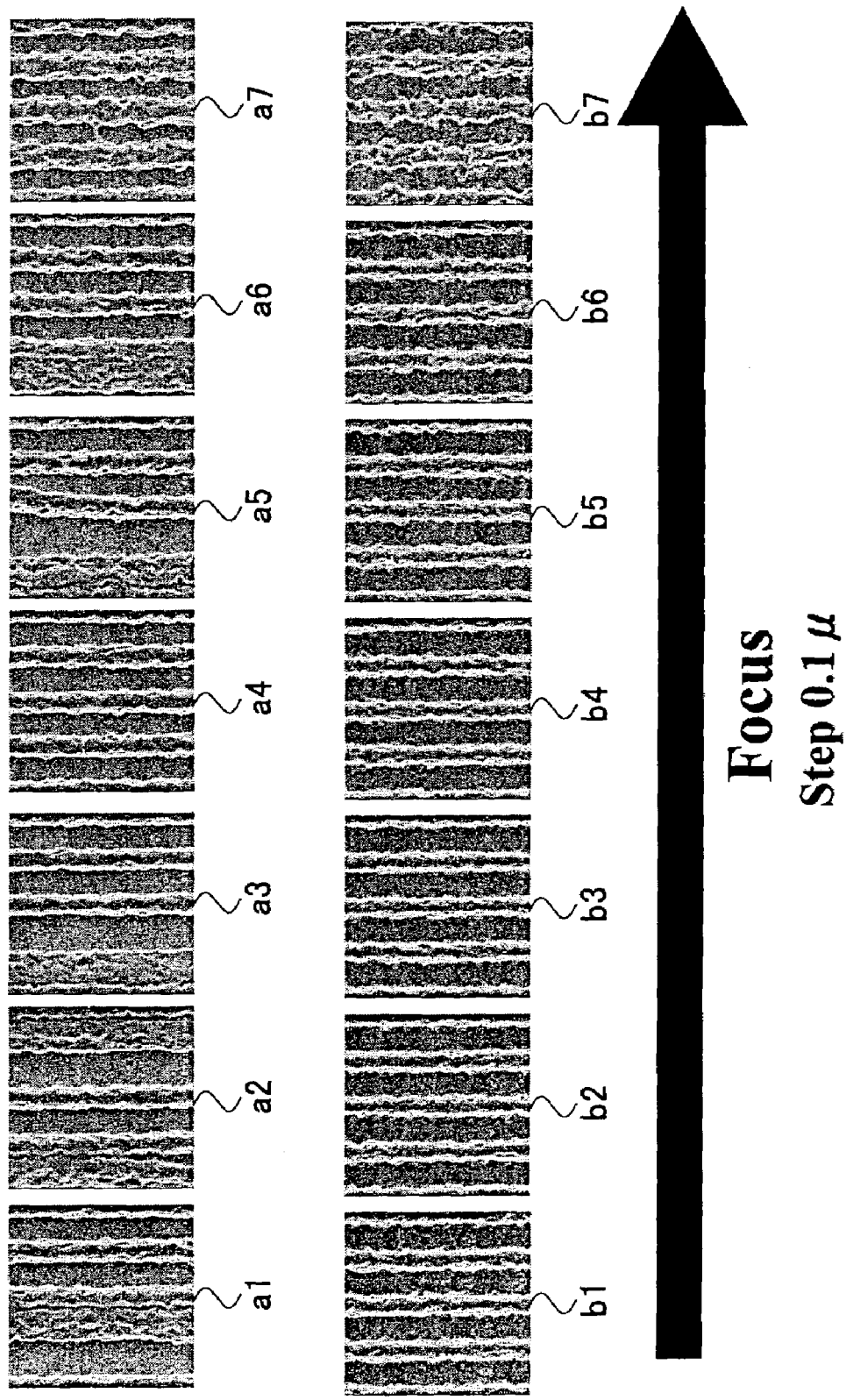
FIG. 3 is a diagram showing the shape of the resist patterns having a line-and-spacing of 110 nm obtained while changing the focusing states variously at the time of the exposure process.

FIG. 3 shows SEM images of a line-and-space resist pattern having a line width and a line pitch both set to 110 nm, wherein a1 to a7 of FIG. 3 show the patterns obtained by the conventional process in which no surface-processing agent is used in the step of FIG. 2B explained before, while b1 to b7 show the patterns obtained by the present process while using the surface-processing agent of the present invention in the step of FIG. 2B. In both of the conventional case a1–a7 and the present invention b1–b7 of FIG. 3, the focal point is changed in the exposure process with a step of 0.1 μm. Thereby, it should be noted that the cases of a4 and b4 represent the best focus state.

Referring to FIG. 3, it can be seen that there is no defective resist pattern formation in the conventional case of a4 corresponding to the best focusing state, while there do appear defective patterns such as toppling of the pattern or separation of the pattern form the underlying layer when the focusing state is offset from the best focusing state in the conventional case as represented in a1 to a3 or a5 to a7 of FIG. 3.

On the other hand, when the surface-processing agent of the present invention is used, formation of defective resist pattern is recognized only in the case of b7 and no defective pattern formation is seen in any of the case b1 to the case b6 of FIG. 3. The result of FIG. 3 indicates that the present invention successfully increased the margin of focusing at the time of the exposure step.

Figure 4:
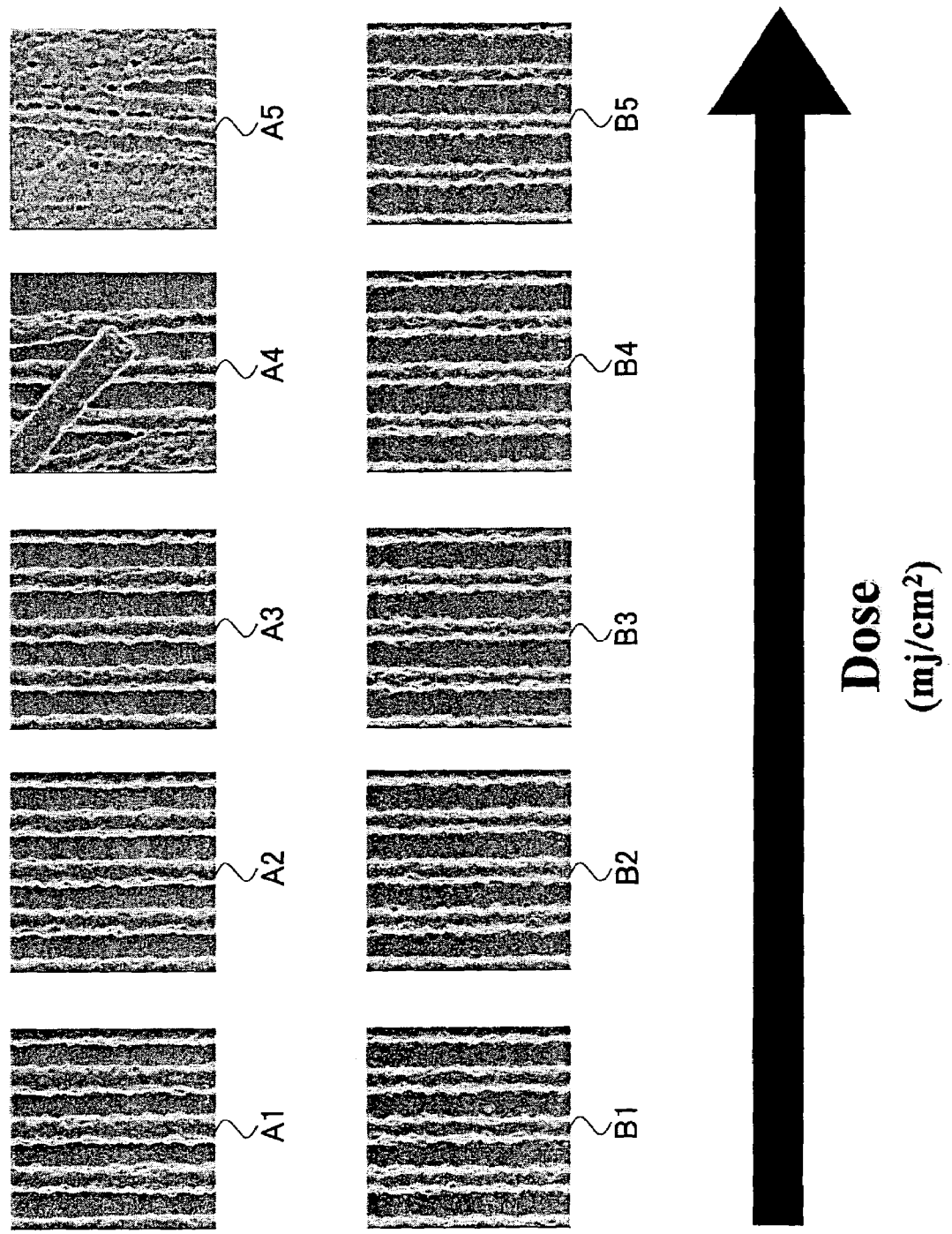
FIG. 4 is a diagram showing the shape of the resist patterns having a line-and-spacing set to 110 nm obtained for the case the exposure dose is changed variously at the time of the exposure process.

FIG. 4 shows SEM images of a line-and-space resist pattern formed with the line width and the line pitch both set to 110 nm, wherein A1 to A5 of FIG. 4 represent the case the exposure dose is changed variously in the conventional process in which no surface-processing agent is used in the step of FIG. 2B explained before while B1–B5 shows the case in which the exposure dose is changed variously in the present invention that uses the surface-processing agent in the step of FIG. 2B. In FIG. 4, the cases of A3 and B3 show the best dose state.

With regard to the conventional cases of A1 to A5 of FIG. 4, it is noted that good patterns are obtained in the cases of A1 to A3 that include underdose cases A1 and A2, while in the overdose cases of A4 and A5 in which excessive exposure dose is given to the resist film, it can be seen that there appear occurrence of defective resist patterns.

In the cases of B1–B5 corresponding to the present invention that uses the surface-processing agent, it is noted that the pattern width is reduced slightly in the cases of B4 and B5 probably because of the overdose exposure, while occurrence of defective resist pattern is not recognized in any of the cases B1–B5. This means that the use of the surface-processing agent of the present invention extends the margin of the exposure dose at the time of the exposure step substantially and that the present invention facilitates easy formation of good resist patterns.

Figure 5:
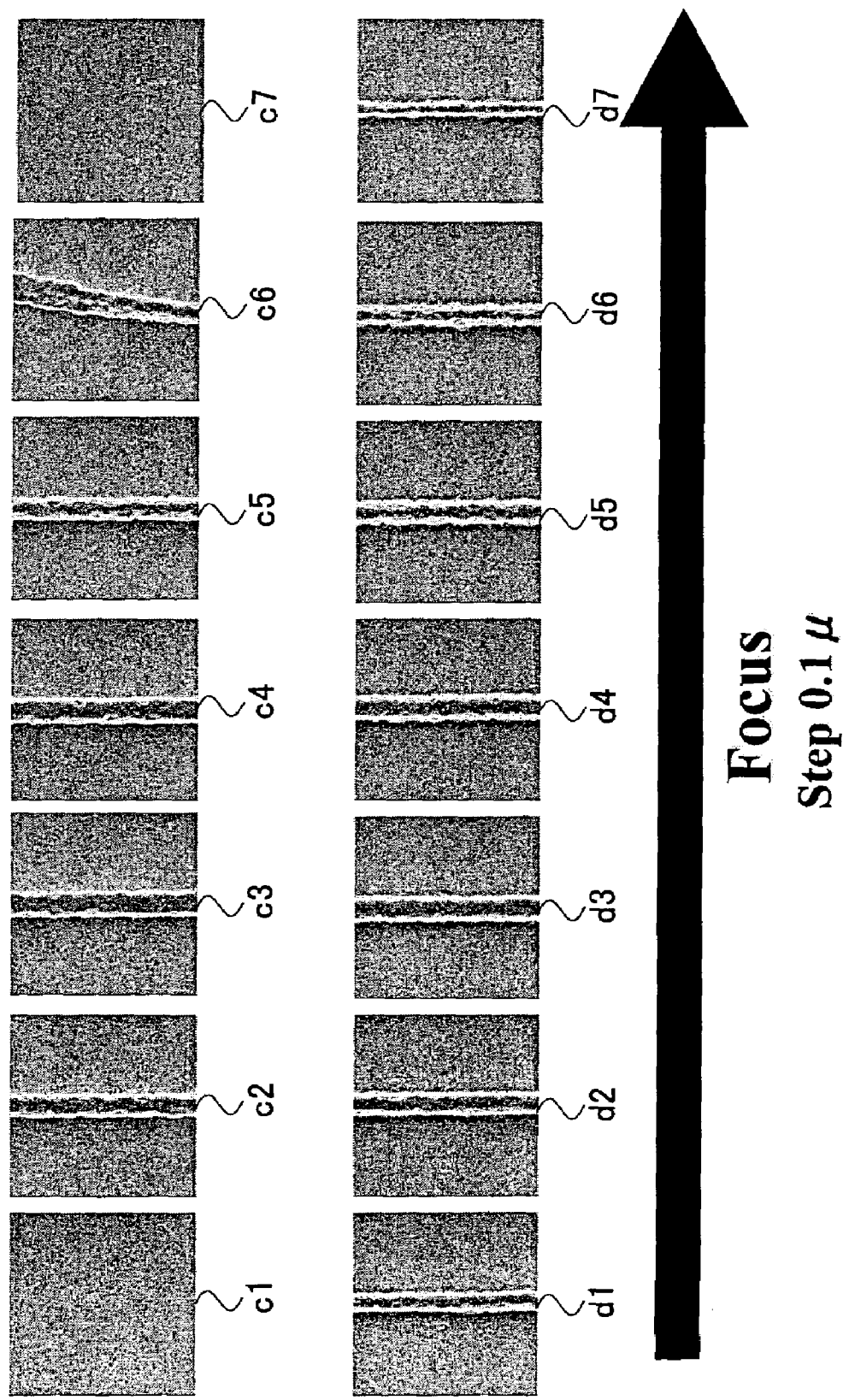
FIG. 5 is a diagram showing the shape of the isolated resist patterns having a line width of 125 nm for the case the focusing state is changed variously at the time of the exposure.

FIG. 5 shows a SEM image of an isolated resist pattern having a pattern width of 125 nm, wherein c1 to c7 represent the conventional case not using the surface-processing agent of the present invention while d1 to d7 represent the case of the present invention that uses the surface-processing agent of the present invention. In any of the conventional case of c1 to c7 and the present invention of d1 to d7, the focusing state is changed with the step of 0.1 μm similarly as before. Thereby, the cases of c4 and d4 correspond to the best focusing state.

Regarding to the conventional case of c1 to c7, it is noted that the resist pattern is separated from the underlying layer and is gone in the case of c1. Similarly, separation or toppling of the resist pattern is observed in c6 to c7 of FIG. 5.

In the case of the present invention represented in d1 to d7 of FIG. 5, on the other hand, a properly shaped good pattern is observed in any of the focusing states. Thus, it was demonstrated that the present invention of using the surface-processing agent is effective also for the case of patterning isolated resist patterns.

Third Embodiment

The effect on the improvement of process margin will be explained with reference to FIG. 6, as a third embodiment of the present invention.

Figure 6:
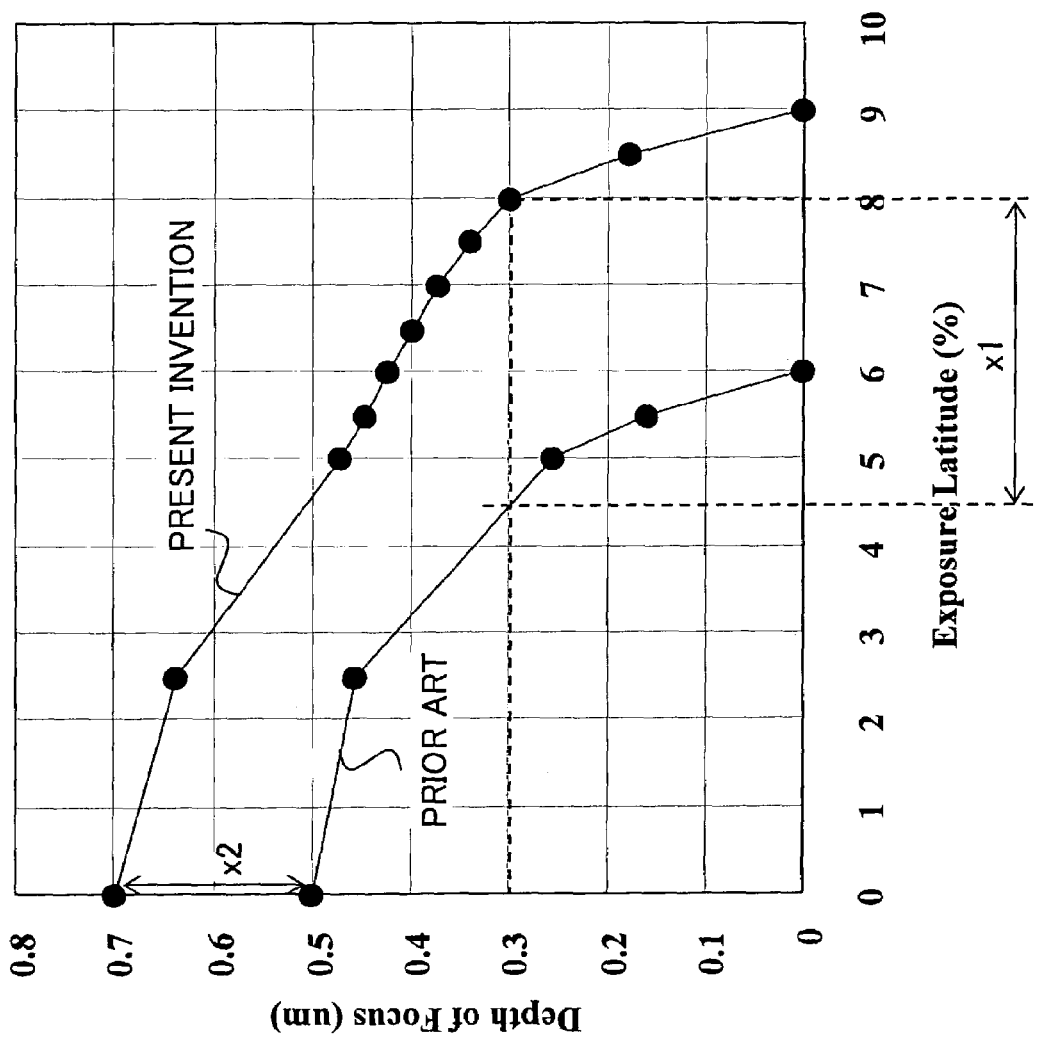
FIG. 6 is a diagram showing the processing margin for the case of exposing a resist pattern having a line-and-spacing of 110 nm.

FIG. 6 shows the relationship between the tolerance or latitude of exposure time as measured from an optimum time of exposure and the focal depth for the case of a line-and-space pattern having a pattern width and a pattern pitch set to 110 nm, wherein the horizontal axis represents the exposure latitude while the vertical axis represents the focal depth.

Referring to FIG. 6, it can be seen that the magnitude of the tolerance has increased from the conventional value of 4.5% to 8.0% as a result of use of the present invention for the case the focal depth is set to 0.3 μm. In other words, FIG. 6 shows that the present invention successfully extended the process margin and that the magnitude of tolerance has been increased with the amount x1 with regard to the exposure time as shown in FIG. 6. Furthermore, it is also noted in FIG. 6 that the focal depth has been improved as a result of the use of the present invention. For example, the focal depth at the zero% exposure tolerance has been increased from the conventional value of 0.5 μm to the value of 0.7 μm in the present invention as shown with x2 in FIG. 6.

Figure 7:
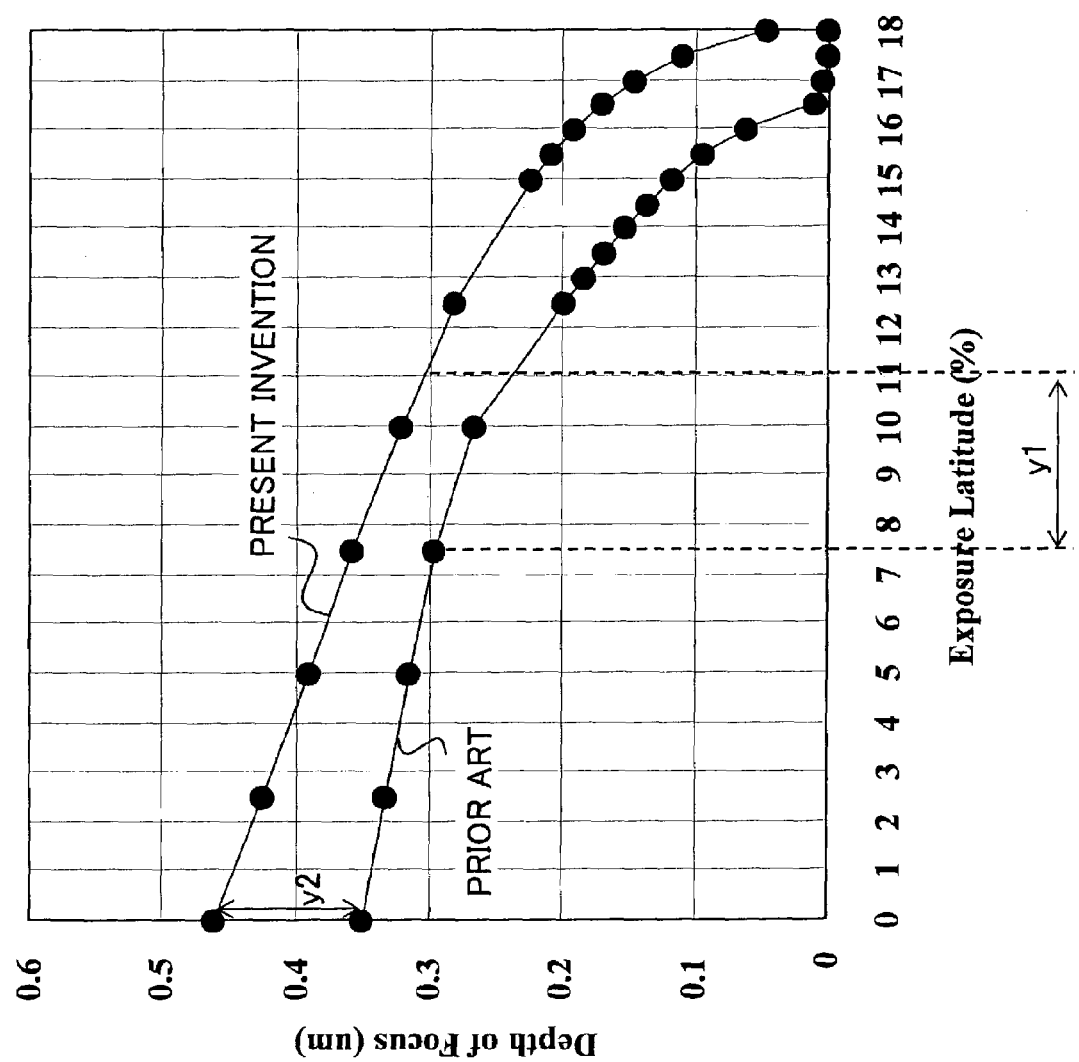
FIG. 7 is a diagram showing the processing margin for the case of exposing an isolated pattern, having a lined width of 125 nm.

Similarly, FIG. 7 shows the result for an isolated pattern having the line width of 125 nm, wherein FIG. 7 compares the tolerance of exposure time and focal depth between the conventional case and the present invention similarly to the example of FIG. 6.

Referring to FIG. 7, it can be seen that the magnitude of tolerance has increased from the conventional value of 7.5% to the value of 11.0% in the present invention when the comparison is made under the condition that the focal depth is set to 0.3 μm. In other words, the value of tolerance has been improved by the amount shown by y1 in FIG. 7. Furthermore, it can be seen that the focal depth has been improved from the conventional value of 0.35 μm to 0.45 μm in the present invention when the comparison is made under the condition that the exposure latitude is zero. Thus, it can be seen that extension of process margin is also observed also in the case of an isolated pattern, although the magnitude of improvement may be smaller than the case of the line-and-space pattern having the pattern width and the pattern pitch of 110 nnm.

Fourth Embodiment

Next, the process of fabricating a semiconductor device by using the process of the present invention will be explained with reference to FIG. 8A to FIG. 8I as a fourth embodiment of the present invention In the drawings, those parts corresponding to the parts described previously are designated by the same reference numerals and the description thereof will be omitted. It should be noted that FIGS. 8A–8I represent the fabrication process of a CMOS device.

Referring to FIG. 8A, an STI structure 103 is formed on a silicon substrate 101 as a device isolation structure, wherein the STI structure 103 defines a device region 102$a$ for an n-channel MOSFET and a device region 102$b$ for a p-channel MOSFET. The device region 102$a$ is doped to a p⁻-type by an ion implantation process of a p⁻-type element, while the device region 102$b$ is doped to an n⁻-type by an ion implantation process of an n--type impurity element.

The foregoing device regions 102$a$ and 102$b$ are covered with a thermal oxide film including a thermal oxide part 104$a$ and a thermal oxide part 104$b$, wherein the thermal oxide part 104$a$ acts as a gate insulation film of the n-channel MOSFET to be formed in the device region 102$a$ while the thermal oxide part 104$b$ acts as a gate insulation film of the p-channel MOSFET to be formed in the device region 102$b$. Further, a polysilicon film including a polysilicon region 105$a$ and a polysilicon region 105$b$ are formed so as to cover the gate insulation film 104$a$ and the gate insulation film 104$b$ continuously. Further, the polysilicon region 105$a$ is doped with an n-type impurity element while the polysilicon region 105$b$ is doped with a p-type impurity element.

Further, the polysilicon 105$a$ region and the polysilicon region 105$b$ are covered with a silicon oxide film 106, wherein the silicon oxide film 106 is used later as a hard mask at the time of etching the polysilicon film at the polysilicon regions 105$a$ and 105$b$.

In present embodiment, the silicon oxide film 106 is patterned according to the predetermined gate electrode patterns to be formed respectively in the device region 102A and the device region 102B by an etching process described previously with reference to the first embodiment, wherein the silicon oxide patterns thus obtained are used as a hard mask when patterning the polysilicon regions 105$a$ and 105$b$ to form a gate electrode in each of the device regions 102A and 102B. The steps corresponding to the above will be explained in FIG. 8B onwards.

In the step of FIG. 8B, a novolac resin film 107 corresponding to the novolac resin 11 noted in FIG. 2A is applied on the silicon oxide film 106. After curing, an SOG film 108, added with an photoacid generator is formed further on the novolac resin film 107 by a spin-on process similarly to the SOG film 12 of FIG. 2A.

Next, in the step of FIG. 8C, a basic surface-processing agent 109 similar to the one explained with reference to the first embodiment is applied on the SIG film 108 by a spin-on process so that the basic surface-processing agent is dispersed uniformly over the entire substrate.

Next, in the step of FIG. 8D, a chemical amplification resist 110 called ArF resist is applied on the surface of the SOG film 108 thus processed with the basic surface-processing agent. The resist 110 thus formed is subsequently exposed to DUV from an ArF excimer laser. As a result of the exposure, the photoacid generator contained in the ArF resist 110 and the photoacid generator contained in the SOG film 108 produce a photoacid, wherein the photoacid thus released causes diffusion through the resist 110 and the SOG film 108 as a result of the PEB process conducted after the exposure process, wherein the surface surface processing agent 109 applied to the surface of the SOG film 108 neutralizes any excessive photoacid precipitating at the interface between the SOG film 108 and the ArF resist 110, and the effect of the excessive photoacid accumulating at the resist/under-layer interface is cancelled.

Therefore, when a developing process is conducted as shown in the step of FIG. 8E, the problems of defective pattern formation such as the separation of the resist pattern or toppling of the resist pattern, are successfully eliminated, and resist patterns 110A and 110B corresponding to the gate electrode patterns are formed respectively in correspondence to the device region 102A and the device region 102B.

Next, in the step of FIG. 8F, the SOG film 108 is subjected to a patterning process conducted by a dry etching process while using the resist patterns 110A and 110B as a mask. The dry etching process may be the one that uses $CHF_3$ and $O_2$ as an etching gas. As a result of the patterning of the SOG film 108, SOG patterns 108A and 108B are formed respectively in correspondence to the resist patterns 110A and 110B.

In the step of FIG. 8G, the novolac resin film 107 is patterned by a dry etching process using an $H_2/O_2$ mixture as an etching gas, and novolac resin patterns 107A and 107B are formed in conformity with the SOG patterns 108A and 108B respectively, wherein it should be noted that the resist patterns 110A and 11B remaining on the SOG patterns 108A and 108B are etched out during the patterning process of FIG. 8G.

Next, in the step of FIG. 8H, the silicon oxide film 106 is patterned by a dry etching process that uses $CF_4$ as an etching gas while using the novolac resin patterns 107A and 107B as a mask. As a result, oxide patterns 106A and 106B are formed respectively in conformity with the novolac resin patterns 107A and 107B, wherein it should be noted that the SOG patterns 108A and 10B remaining on the novolac resin patterns 107A and 107B are etched out during the process of FIG. 8H.

Next, in the step of FIG. 8I, the polysilicon regions 105a and 105b are patterned while using the silicon oxide patterns 106A and 106B as respective masks. As a result of the patterning of the polysilicon regions 105a and 105b, gate electrodes 111a and 111b are formed respectively in the device region 102A and in the device region 102B.

Further, in the step of FIG. 8I, n-type impurity ions are implanted into the device region 102a through the thermal oxide film 104a while using the gate electrode pattern 111a as a mask. Further, p-type impurity ions are implanted into the device region 102b through the thermal oxide film 104b while using the gate electrode pattern 111b as a mask. The ion implantation process of the n-type ions and the ion implantation process of the p-type ions are conducted separately, and as a result, there are formed n-type diffusion regions 112a and 112b in the device region 102a of $p^-$-type at both lateral sides of the gate electrode 111a. Similarly, p-type diffusion regions 112c and 112d are formed in the elemental device region 102a and in the device region 102b of $n^-$-type at both lateral sides of the gate electrode 111b.

Next, in the step of FIG. 8J, the gate electrode pattern 111a is provided with a pair of sidewall insulation films 113a and 113b at the opposing sidewall surfaces thereof. Further, the gate electrode pattern 111b is provided with a pair of sidewall insulating films 113c and 113d at the opposing sidewall surfaces thereof.

After formation of the sidewall insulation films 113a and 113b and the sidewall insulation films 113c and 113d, n-type impurity ions are introduced into the device region 102a while using the gate electrode 111a and the sidewall insulation films 113a and 113b as a mask. Further, p-type impurity ions are introduced into the device region 102b while using the gate electrode 111b and the sidewall insulation films 113c and 113d as a mask. By conducting a thermal annealing process for activating the impurity ions thus introduced, n-type diffusion regions 114a and 114b are formed in the device region 102a at both lateral sides of the sidewall insulation films 113a and 113b. Further, p-type diffusion regions 114c and 114d are formed in the device region 102b at both lateral sides of the sidewall insulation films 113c and 113d.

In the process of the present embodiment, it is possible to pattern the gate electrodes 111a and 111b with respective, exact pattern widths or gate lengths, by applying the surface-processing agent 109 to the SOG film 108 in the step of FIG. 8C. Thereby, the patterning of the gate electrode is conducted with high precision even in the case the semiconductor device is the one used for the ultrahigh-speed applications and has the gate length of 0.1 µm or less.

Fifth Embodiment

Figure 9:
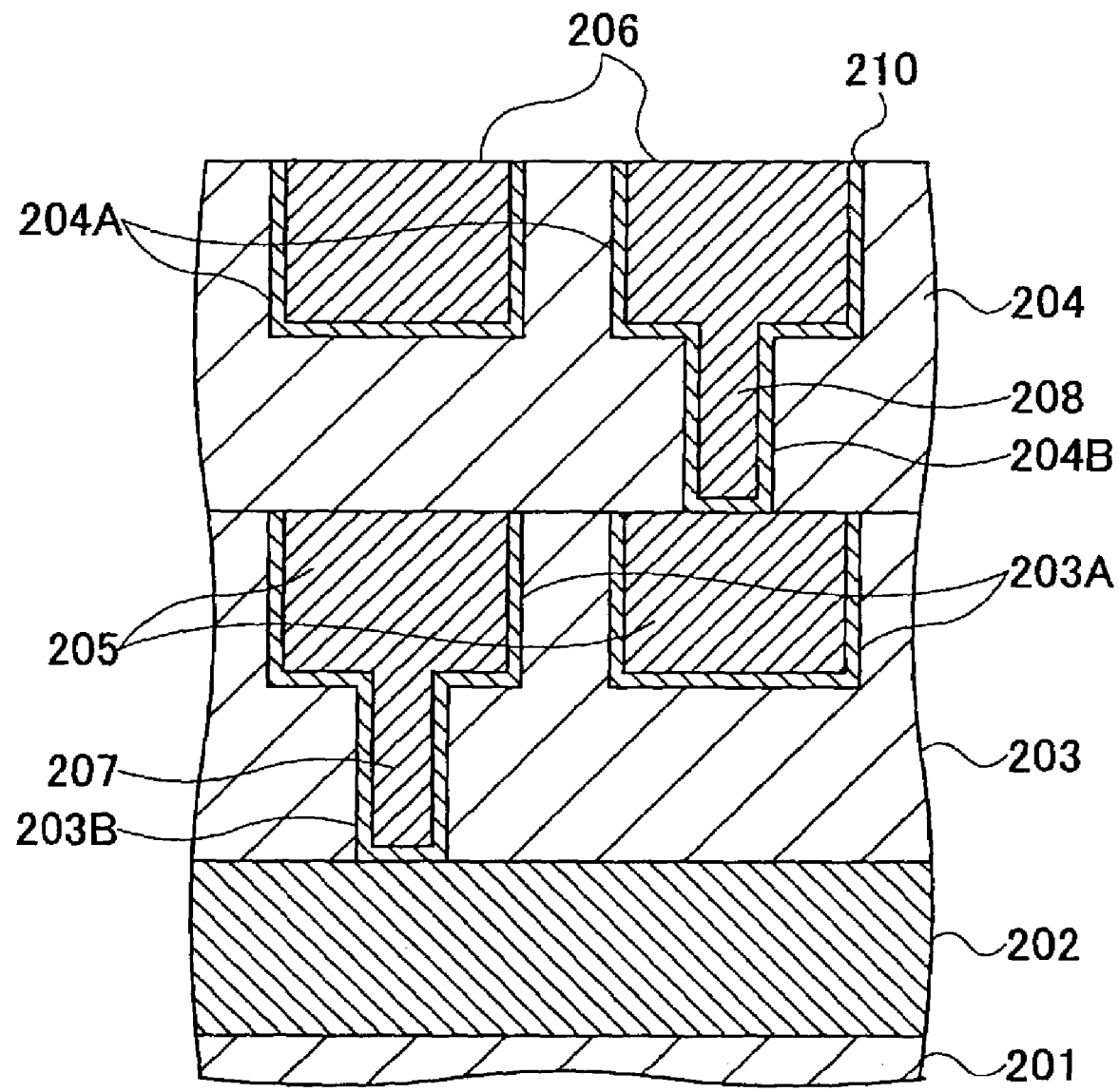
FIG. 9 is a diagram showing an example of a semiconductor device fabricated according to the process of the present invention.

FIG. 9 is a diagram showing a part of a semiconductor integrated circuit device 200 formed by the fabrication process according to a fifth embodiment of the present invention.

Referring to FIG. 9, an insulating film 201 of silicon oxide and the like, is formed so as to cover MOS devices (not shown) on a silicon substrate, wherein the semiconductor integrated circuit further includes a wiring layer 202 typically formed of Cu in electrical connection with the MOS devices via an interconnecting structure formed of W or the like (not shown).

Further, a first insulating layer 203 and a second insulating layer 204 are formed on the wiring layer 202, wherein it can be seen that the first insulating layer 203 is formed with wiring grooves 203A and the second insulating layer 204 is formed with wiring grooves 204A, and Cu wiring patterns 205 and 206 are formed so as to fill the wiring grooves 203A and 204A respectively.

Furthermore, via holes 203B and 204B are formed in each of the first and second insulating layers 203 and 204 thus forming Cu contacts 207 and 208 therein. A barrier layer 210 is formed in each of the grooves 203A and 204A including the via holes 203B and 204B so as to intervene between the insulating layer 203 and the Cu wirings 205 or the Cu contact 207, or between the insulating layer 204 and the Cu patterns 206 or the Cu contact 208.

In the structure of FIG. 9, the present invention can be applied when forming a pattern by conducting etching in the first insulating film 203 or in the second insulating film 204. For example, the present invention can be used when forming the wiring groove 203A and the via hole 203B in the first insulating film 203, or when forming the wiring groove 204A and the via hole 204B in the second insulating film 204.

In the event the first insulating layer 203 and the second insulating layer 204 are formed of an organic film such as an organic SOG film including an MSQ film and a porous MSQ film, a carbon film added with fluorine, a SiCO film, a SiCO(H) film, or an SiCH film, it is possible to use an inorganic film such as a silicon oxide film as a mask when patterning the first or second insulating layer 203 or 204. Thereby, the patterning of the inorganic mask layer thus formed on the first insulating film 203 or the second insulating film 204 can be accomplished according to the method described in the first embodiment.

Furthermore, in the event the first insulating film 203 and the second insulating film 204 are formed of an inorganic film such as an inorganic SOG film, a silicon oxide film, an HSQ film, a porous HSQ film, or a porous $SiO_2$ film, the insulating films can be etched directly according to the method described in the first embodiment.

As explained heretofore, the method of fabricating a semiconductor device according to the present invention includes the method of applying a surface-processing agent to the SOG film surface located underneath the resist. However, it is possible to use a CVD film for the underlying film. Furthermore, the present invention of applying a surface-processing agent is also effective in the case when a BARC is used as the film underlying the resist. Moreover, the present invention is effective also in the case a BARL (Bottom Anti-Reflection Layer), deposited by a CVD process, is provided as the under-layer of the resist film, in place of a BARC, which is formed by a spin-on process.

The present invention is not limited to specifically disclosed embodiments, and variations and modifications may be made without departing from the scope of the present invention.

What is claimed is:

1. A method of fabricating a semiconductor device comprising the steps of:
   forming an insulating film on a surface;
   applying a surface processing agent on said insulating film, said surface processing agent containing at least a solvent and a basic component;
   applying a resist on said insulating film applied with said substrate-surface surface processing agent;
   patterning said resist by lithography to form a resist pattern; and
   patterning said insulating film by the dry etching process while using said resist pattern as a mask,
   wherein said surface processing agent neutralizes photo-acids released from said resist or said insulating film, thereby effectively suppressing defective patterning at the interface of said insulating film and resist interface.

2. The method as claimed in 1, wherein said surface processing agent contains said solvent with a proportion of 90 to 99.99% and said basic component with a proportion of 0.01 to 10%.

3. The method as claimed in 1, wherein said solvent comprises a mixed solution of PGMEA (propylene glycol monomethyl ether acetate) and PGME (propylene glycol monomethyl ether).

4. The method as claimed in 1, wherein said basic component comprises any of an organic amine and an ammonium salt.

5. The method as claimed in 1, wherein said basic component includes a compound represented by a formula

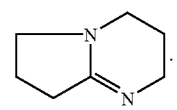

6. The method as claimed in 1, wherein said basic component has a strength of a base that neutralizes photo-acids released from said resist or said insulating film.

7. The method as claimed in 1, wherein said step of applying said surface processing agent and said step of applying said resist are conducted in continuation.

8. The method as claimed in 1, wherein said resist is a chemical amplification resist.

9. The method as claimed in 1, wherein said insulating film is added with a photoacid generator.

10. The method as claimed in 1, wherein said insulating film is formed by a spin-on method.

11. The method as claimed in 1, wherein said dry etching process is conducted by using a gas containing a fluorine compound as an etching gas.

12. The method as claimed in 1, wherein said insulating film forms a pattern as a result of said dry etching process, and wherein said pattern is transferred onto another insulating film formed between said surface and said insulating film by another dry etching process.

13. The method as claimed in 12, wherein said another insulating film is a polymer film.

14. The method as claimed in 13, wherein said polymer is a novolac resin film.

15. The method as claimed in 1, wherein said another dry etching process uses a gas containing hydrogen and oxygen as an etching gas.

16. The method as claimed in 12, wherein said another insulating film forms another pattern as a result of said another dry etching process, and wherein said another pattern is transferred onto a further insulating film formed under said another insulating film between said surface and said another insulating film by conducting a further dry etching process.

17. The method as claimed in 16, wherein said further insulating film comprises a silicon compound film.

18. The method as claimed in 17, wherein said silicon compound film is a silicon oxide film.

* * * * *